US008718583B2

(12) United States Patent
Bergman

(10) Patent No.: US 8,718,583 B2
(45) Date of Patent: May 6, 2014

(54) METHOD AND APPARATUSES FOR TRANSMITTER TO MULTI-CARRIER POWER AMPLIFIER CONFIGURATION

(75) Inventor: Petter Bergman, Ljungsbro (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 309 days.

(21) Appl. No.: 13/288,368

(22) Filed: Nov. 3, 2011

(65) Prior Publication Data

US 2012/0071196 A1    Mar. 22, 2012

(51) Int. Cl.
*H04B 1/04*    (2006.01)
*H04K 1/02*    (2006.01)

(52) U.S. Cl.
USPC ............ 455/127.3; 455/114.3; 455/522; 330/51; 375/297

(58) Field of Classification Search
USPC ......... 455/114.3, 127.1, 127.3, 144, 194.2, 455/522, 68, 69, 108, 45, 103; 330/51, 127, 330/136; 375/260, 261, 295–297
See application file for complete search history.

(56) References Cited

U.S. PATENT DOCUMENTS

| 5,710,990 | A | 1/1998 | Long et al. |
| 6,292,053 | B1 | 9/2001 | Ke |
| 7,146,138 | B2 * | 12/2006 | Anvari .................. 455/114.3 |
| 7,715,493 | B2 * | 5/2010 | Ravi et al. ................. 375/296 |
| 8,155,237 | B2 * | 4/2012 | Ahmed ..................... 375/295 |
| 8,275,319 | B2 * | 9/2012 | Dakshinamurthy et al. .... 455/45 |
| 8,326,244 | B2 * | 12/2012 | Maruhashi et al. ....... 455/127.1 |
| 2003/0096630 | A1 * | 5/2003 | Dartois .................. 455/522 |
| 2004/0100323 | A1 * | 5/2004 | Khanifar et al. ........... 330/51 |
| 2004/0109511 | A1 * | 6/2004 | Lee ....................... 375/296 |
| 2004/0141548 | A1 * | 7/2004 | Shattil ..................... 375/146 |
| 2005/0135312 | A1 * | 6/2005 | Montojo et al. ............. 370/335 |
| 2007/0004351 | A1 * | 1/2007 | Dekker ................. 455/127.1 |
| 2007/0032208 | A1 * | 2/2007 | Choi et al. .............. 455/114.3 |
| 2007/0115170 | A1 * | 5/2007 | Kojima ................... 342/350 |
| 2007/0147528 | A1 * | 6/2007 | Kim et al. ................ 375/260 |

(Continued)

FOREIGN PATENT DOCUMENTS

| EP | 1 100 147 | 5/2001 |
| EP | 2 346 175 | 7/2011 |
| WO | WO 01/15335 | 3/2001 |

OTHER PUBLICATIONS

Extended European Search Report for European Patent Application No. 10150879.4 mailed Jun. 23, 2010.

(Continued)

*Primary Examiner* — Dominic E Rego
(74) *Attorney, Agent, or Firm* — Myers Bigel Sibley & Sajovec, P.A.

(57) ABSTRACT

The invention relates to a method for configuring a set of multi-carrier power amplifiers, MCPAs, to provide power amplification for a set of base station transmitters. The method is characterized by switching at least a first MCPA in the set of multi-carrier power amplifiers such that the at least first MCPA stops providing power amplification to at least a first subset of the set of base station transmitters, and switching at least a second MCPA in the set of multi-carrier power amplifiers such that the at least second MCPA starts to provide power amplification to the at least first subset of the set of base station transmitters. The invention also relates to a distributing unit connectable to such a base station and a base station comprising a distributing unit.

15 Claims, 5 Drawing Sheets

(56) References Cited

U.S. PATENT DOCUMENTS

2007/0287393 A1* 12/2007 Nandipaku et al. ......... 455/127.1
2008/0037662 A1* 2/2008 Ravi et al. .................... 375/260
2011/0269405 A1* 11/2011 Bjorken ...................... 455/67.11

OTHER PUBLICATIONS

Amendment to European Application No. EP10150879.4, Jan. 20, 2012, 24 pages.

* cited by examiner

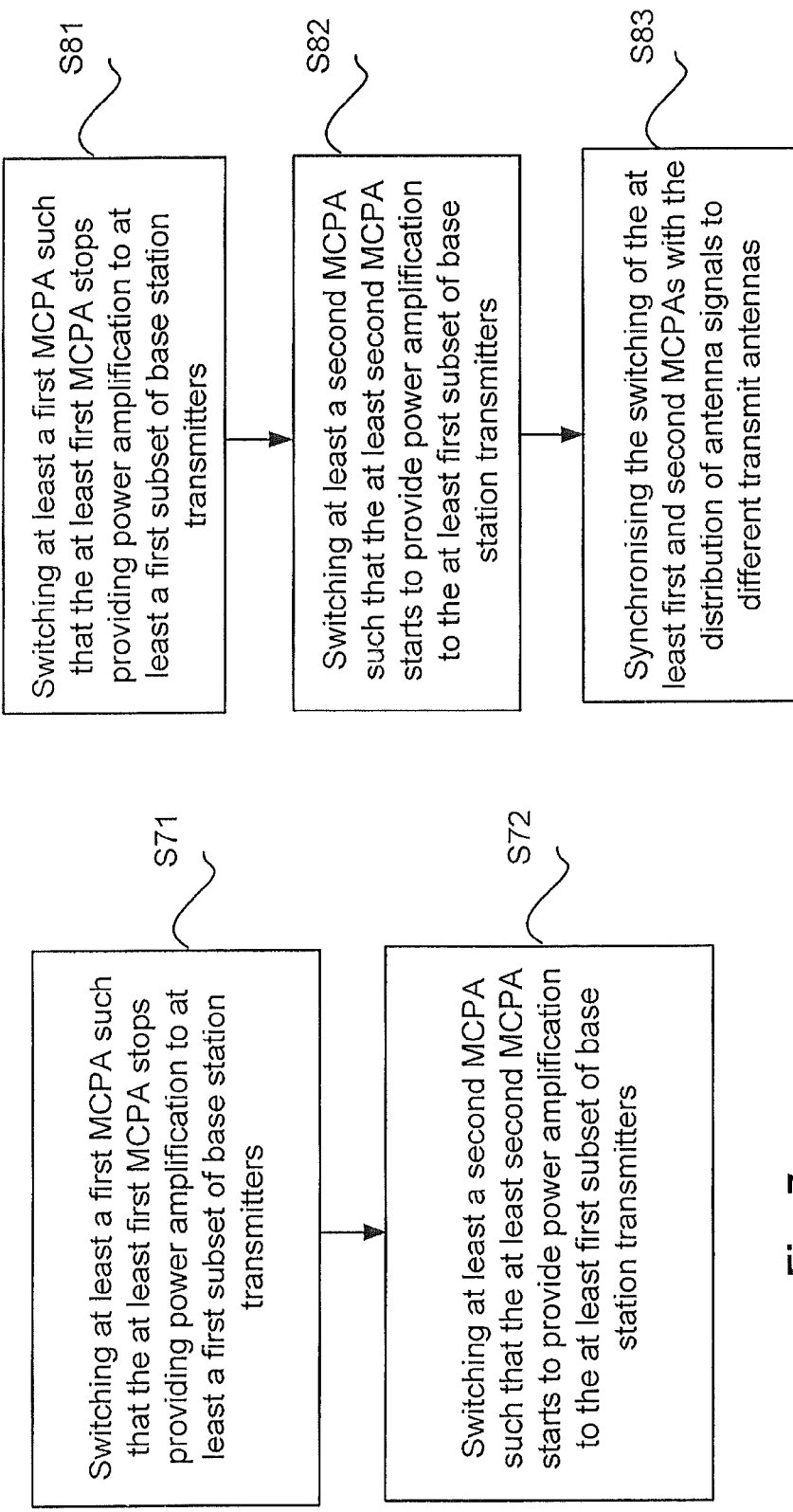

METHOD AND APPARATUSES FOR TRANSMITTER TO MULTI-CARRIER POWER AMPLIFIER CONFIGURATION

CROSS REFERENCE TO RELATED APPLICATION

This application is related to U.S. Provisional Application No. 61/295,404 filed Jan. 15, 2010, and to European Application No. 10150879.4 filed Jan. 15, 2010, now published as European Publication No. EP 2346175 on Jul. 20, 2011. The disclosures of all of the above referenced applications and publications are hereby incorporated herein in their entireties by reference.

TECHNICAL FIELD

The present invention generally relates to systems for signal amplification in wireless communication base stations, and particularly relates to a method and apparatuses for transmitter to Multi-Carrier Power Amplifier configuration.

BACKGROUND

Multi-carrier Power Amplifier (MCPA) technology is being developed for a variety of wireless communication system types, including for example systems based on GSM and CDMA standards. For example, Telefonaktiebolaget LM Ericsson (publ.) (hereinafter referred to as ERICSSON only) manufactures an RBS 6000 family of radio base stations, which include one or more shared radio units (RUs), providing multicarrier amplification for a wide variety of radio technologies (GSM, WCDMA, LTE, etc.). Before the advent of MCPA, base stations used individual power amplifiers for the various carrier signals being transmitted, or at least used different power amplifiers for different carrier frequencies and types. In contrast, multiple carrier signals of different frequencies and, possibly, different modulation formats, can be "summed" together in either the digital or analog domains, to form a composite signal for power amplification by an MCPA. The MCPA correspondingly is configured with a sufficient amplifier bandwidth and an overall power rating to provide power amplification for the composite signal.

This capability allows several base station transmitters, each outputting a distinct carrier signal for power amplification and transmission, to use the same MCPA. The MCPA thus may be understood as a wideband power amplifier having multiple signal inputs that are combined for overall power amplification. Using this arrangement, a given base station will commonly include a number of baseband units and a number of radio units. Each radio unit includes an MCPA. Correspondingly, each baseband unit includes at least one transmitter, with each such transmitter outputting a carrier signal at or otherwise corresponding to a given carrier frequency, for power amplification by an assigned one of the MCPAs.

The power limit of each MCPA restricts the number of transmitters that can be assigned to it. A typical approach to "dimensioning" a base station's MCPAs sets the number of transmitters assigned to a given MCPA based on the expected power requirements of the carrier signals from those transmitters (which may be evaluated based on worst-case peak power requirements, or based on expected average power requirements). For example, a 60 Watt (W) MCPA cannot, generally, support the worst-case power requirements of two transmitters having a maximum power requirement of 45 W each, but it may be able to support them with the assumption that they will not simultaneously require full power amplification. Thus, the two transmitters may be assigned to the MCPA, perhaps with provisions for power-clipping and/or power backoffs during instances when the actual combined power requirements of the two transmitters exceed the 60 W capabilities of the MCPA.

The transmit power of an MCPA may be defined by the combination of average power capability (for example 60 W) and peak power capability. The peak power can instantaneously be, for example, 6 dB higher than the average power and is used to handle peak-to-average variations of the composite signal. The peak-to-average ratio depends on the number of carriers and the modulations used. As an example, a single carrier with GMSK modulation has 0 dB peak-to-average ratio while the peak-to-average ratio of two 8-PSK carriers is around 6.2 dB.

Of course, clipping and/or backoffs cannot be overly aggressive, or transmit signal quality suffers. Thus, dimensioning according to this approach essentially requires the base station designer to dedicate a given MCPA to a given number of base station transmitters, with appropriate matching by the designer of each MCPA's power capacity to the expected power requirements of the transmitters assigned to it.

SUMMARY

It is understood by the inventor that it is desirable to be able to increase the total amount of output power amplification that the Multi-Carrier Power Amplifiers (MCPAs) in a base station may provide for a set of base station transmitters.

This desire is addressed by a method for configuring a set of multi-carrier power amplifiers, MCPAs, to provide power amplification for a set of base station transmitters.

The method comprises switching at least a first MCPA in the set of multi-carrier power amplifiers such that the at least first MCPA stops providing power amplification to at least a first subset of the set of base station transmitters, and switching at least a second MCPA in the set of multi-carrier power amplifiers such that the at least second MCPA starts to provide power amplification to the at least first subset of the set of base station transmitters.

By performing the switching operations according to the above, the at least first subset of the set of base station transmitters is allowed to utilize the power capabilities of the at least second MCPA as the average power capability of the at least first MCPA is limiting the available output effect for the at least first subset of the set of base station transmitters. Any MCPA may for short periods of time provide a peak power amplification for any subset of the set of base station transmitters provided that over a longer period of time the average power required by the subset of the set of base station transmitters is below the maximum average power of the MCPA. Thus, for example, as the at least first MCPA is providing peak power amplification to the at least first subset of the set of base station transmitters for longer periods of time and may be close to start limiting the available output effect for the at least first subset of the set of base station transmitters due to exceeding the maximum average power, the switching operations according to the above may switch such that the at least second MCPA starts to provide power amplification to the at least first subset of the set of base station transmitters instead of the at least first MCPA. It follows that the average power provided by the at least second MCPA to the at least first subset of the set of base station transmitters will thus be below the maximum average power of the at least second MCPA, while maintaining the power amplication at the at least first MCPA would lead to exceeding the maximum average power of the at least first MCPA and limit the available output effect for the at least first subset of the set of base station transmitters. Thus, the total amount of output power amplification that the at least first and second MCPA may provide for the at least first subset of the set of base station transmitters is increased as compared to the prior art example described in the background above.

This also provides the advantage that a subset of base station transmitters that require peak power amplification for longer periods of time may share the power capability of at least a first and a second MCPA, and therefore will not suffer from being limited in output power amplification by the maximum average power requirement of a single MCPA.

The switching of the at least a first MCPA may further comprise switching the at least first MCPA such that the at least first MCPA starts to provide power amplification to at least a second subset of the set of base station transmitters. This advantageously allows the at least a first MCPA to take over at least a second subset of the set of base station transmitters and start to provide power amplification to this at least a second subset of the set of base station transmitters as it stops providing power amplification to the at least a first subset of the set of base station transmitters. Thus, for example, as the at least first MCPA is providing peak power amplification to the at least first subset of the set of base station transmitters for longer periods of time and is limiting or is close to start limiting the available output effect for the at least first subset of the set of base station transmitters due to exceeding the maximum average power, the at least first MCPA may take over and start to provide power amplification to at least a second subset of the set of base station transmitters which may not require the at least first MCPA to provide peak power amplification, but a lower amount of power amplification. It would then follow that the average power provided by the at least first MCPA falls below the maximum average power of the at least first MCPA, whereby the first MCPA is no longer in any danger of limiting the available output effect for the at least first or second subset of the set of base station transmitters. Thus, the total amount of output power amplification that the at least first and second MCPA may provide for the at least first subset of the set of base station transmitters may be further increased as compared to the prior art example described in the background above.

The switching of the at least second MCPA may further comprise switching the at least second MCPA such that the at least second MCPA stops to provide power amplification to at least a second subset of the set of base station transmitters. This advantageously allows the at least second MCPA to prior to taking over the at least a first subset of the set of base station transmitters from the at least first MCPA and starting to provide power amplification to this at least a first subset of the set of base station transmitters, provide power amplification at least a second subset of the set of base station transmitters. This is of course most advantageous if the at least second subset of the set of base station transmitters has not required the at least second MCPA to provide peak power amplification for a longer period of time resulting in a risk of limiting the available output effect due to exceeding the maximum average power, but a lower amount of power amplification. Thus, the total amount of output power amplification that the at least first and second MCPA may provide for the at least first subset of the set of base station transmitters may be further increased as compared to the prior art example described in the background above.

In accordance with the above and as an exemplary embodiment, at least a first MCPA may be arranged to stop providing power amplification to a first subset of base station transmitters and start providing power amplification to a second subset of base station transmitters, whereby at least a second MCPA may be arranged to simultaneously stop providing power amplification to the second subset of base station transmitters and start providing power amplification to the first subset of base station transmitters. This allows the first and the second subset of base station transmitters to share the power capabilities of the first and a second MCPA. As an example, if the first subset of base station transmitters requires a peak power amplification for a time period which would result in that the maximum average power of the first MCPA is exceeded and the second subset of base station transmitters only requires a substantially lower power amplification of the second MCPA for the same time period, a switch to the second MCPA for the first subset of base station transmitters and a switch to the first MCPA for the second subset of base station transmitters would result in that the first subset of base station transmitters may be provided with peak power amplification for a longer period of time without the maximum average power of the first MCPA is exceeded, while still keeping the substantially lower power amplification for the second subset of base station transmitters for the same time period. The switching operations may also be arranged to switch back the first and second subsets of base station transmitters to their initial MCPA, respectively, after a suitable period of time. This suitable period of time may be chosen in dependence of when the first subset of base station transmitters has required peak power amplification for a time period such that the maximum average power of the second MCPA is in danger of being exceeded. The switching operations described above may be sequentially iterated over time, and thus allow the total amount of output power amplification that the at least first and second MCPA may provide for the first and second subset of the set of base station transmitters to be even further increased as compared to the prior art example described in the background above.

The switching operations described above, i.e. any two or more of the described switching operations of the at least first and second MCPAs in the set of multi-carrier power amplifiers, may be performed substantially simultaneously. By suitably configuring the control and timing schedule of the switching operations, the switching operations may be performed substantially seamlessly, e.g. be performed within a maximum switching timing requirement inherent in the design of the base station.

The switching operations may further be performed such that each of the at least first and second MCPAs in the set of multi-carrier power amplifiers sequentially provides power amplification to each of the at least first and second subsets of the set of base station transmitters in sequence during different phases of operation. This feature advantageously allows all of the subsets of base station transmitters in the set of base station transmitters to share the power capabilities of all of the MCPAs in the set of multi-carrier power amplifiers. For example, during a first phase of operation, a first MCPA may provide power amplification for a first subset of base station transmitters, a second MCPA may provide power amplification for a second subset of base station transmitters, and a third MCPA may power amplification for a third subset of base station transmitters. The switching operations may be arranged to switch such that, during a second phase of operation, the first MCPA may provide power amplification for the second subset of base station transmitters, the second MCPA may provide power amplification for the third subset of base station transmitters, and the third MCPA may power amplification for the first subset of base station transmitters. The switching operations may further be arranged to switch such that, during a third phase of operation, the first MCPA may provide power amplification for the third subset of base station transmitters, the second MCPA may provide power amplification for the first subset of base station transmitters, and the third MCPA may power amplification for the second subset of base station transmitters. Thus, by in this way allowing all of the subsets of base station transmitters in the set of base station transmitters to share the power capabilities of all of the MCPAs, the total amount of output power amplification that the at least first and second MCPA may provide for the at least first and second subset of the set of base station transmitters to be even further increased as compared to the prior art example described in the background above.

The switching operations may yet further be performed such that said switching is performed automatically in between the different phases of operation, each phase of operation having a predetermined duration in time, which are sequentially iterated over time. Thus, for example, the switching operations described in the previous example above may be sequentially iterated over time such that after the third phase of operation has elapsed, a switch may be made back to the power amplification of the first phase of operation, whereby the power amplification sequence may be continuously repeated in the same manner over time. The predetermined duration in time of each phase of operation may be arranged such that no switch occurs during, for example, a GSM burst of the base station transmitters. This may advantageously be performed in order to ensure that no output power amplification effect is lost during the switching operations. The predetermined duration in time of each phase of operation may also be arranged such that it has a longer duration in time than a GSM radio burst, and a shorter duration in time than the maximum allowed time period for the MCPAs to be equal to or exceed their maximum average power.

The switching operations may further comprise synchronising the switching of the at least first and second MCPAs described above with the distribution of antenna signals from the MCPAs to different transmit antennas performed by a distributing unit. This allows each of the subsets of base station transmitters in the base station to each be assigned to and support separate cells, while still sharing the power capabilities of the MCPAs in the base station as described above.

Another aspect of the invention provides a base station comprising a set of base station transmitters and a set of multi-carrier power amplifiers, MCPAs, to provide power amplification for the set of base station transmitters. The base station comprises a control unit that is arranged to: switch at least a first MCPA in the set of multi-carrier power amplifiers such that the at least first MCPA stops providing power amplification to at least a first subset of the set of base station transmitters, and switch at least a second MCPA in the set of multi-carrier power amplifiers such that the at least second MCPA starts to provide power amplification to the at least first subset of the set of base station transmitters.

A further aspect of the invention provides a distributing unit communicatively connectable to a base station according to the above, comprising: a switching unit arranged to receive antenna signals from a set of multi-carrier power amplifiers in the base station and continuously distribute the antenna signals from the set of multi-carrier power amplifiers to different transmit antennas in accordance with targeted MCPAs for the different transmit antennas.

Further advantageous embodiments of the base station and the distributing unit are set forth in the dependent claims and correspond to advantageous embodiments already set forth with reference to the above mentioned method.

BRIEF DESCRIPTION OF THE DRAWINGS

The objects, advantages and effects as well as features of the invention will be more readily understood from the following detailed description of exemplary embodiments of the invention when read together with the accompanying drawings, in which:

FIG. 7 is a logic flow diagram of one embodiment of a method for configuring a set of MCPAs to provide power amplification for a set of base station transmitters.

FIG. 8 is a logic flow diagram of another embodiment of a method for configuring a set of MCPAs to provide power amplification for a set of base station transmitters.

DETAILED DESCRIPTION

Figure 1:
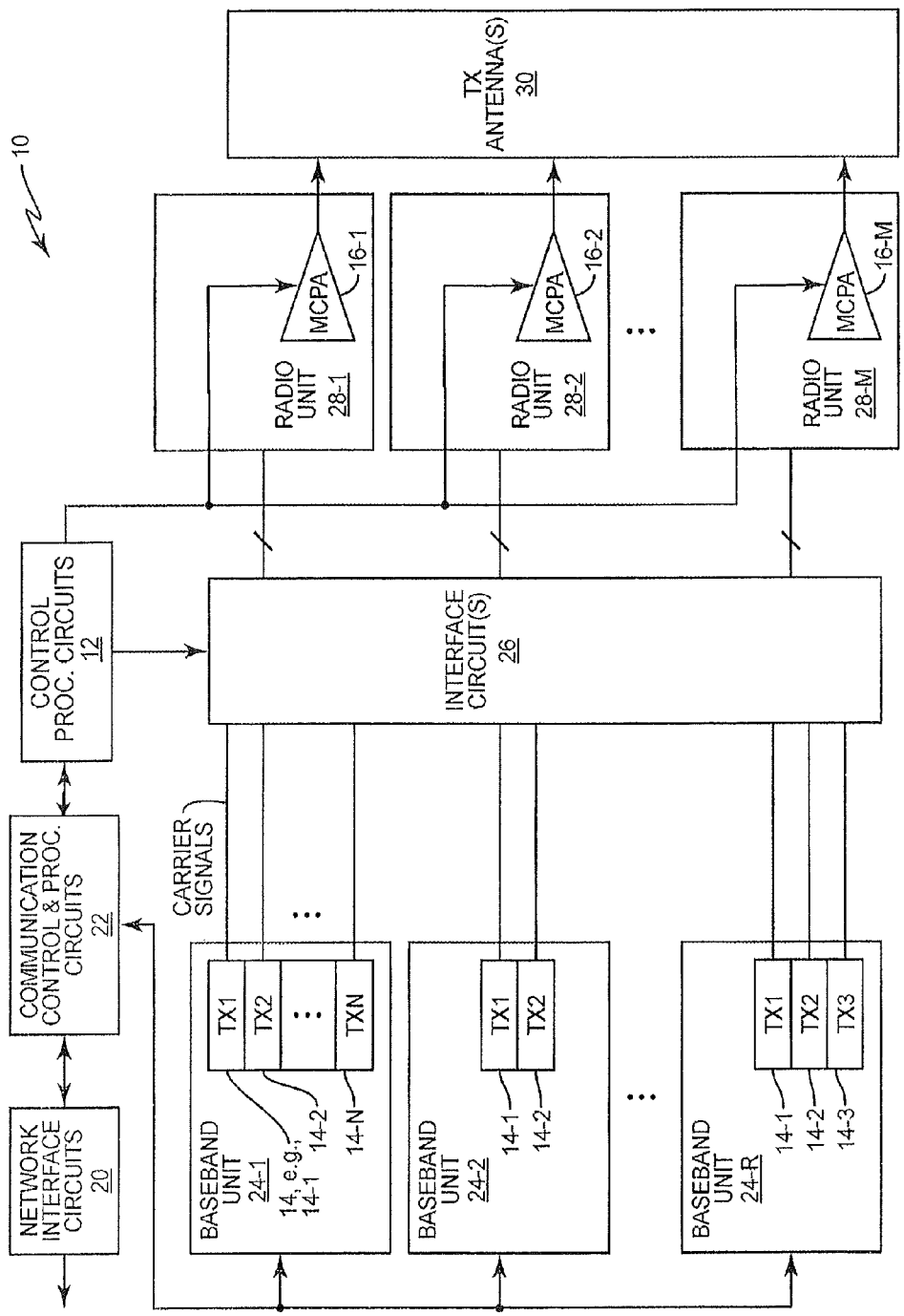
FIG. 1 is a block diagram of one embodiment of a base station that comprises a control circuit providing transmitter to Multi-Carrier Power Amplifier (MCPA) configuration.

FIG. 1 illustrates a base station 10 that comprises a control processing circuit 12, or control unit 12 as referred to hereinafter and in the claims, providing base station transmitter to MCPA configuration. By way of non-limiting examples, the base station 10 may comprise a GSM base station for use in a GSM-based wireless communication network, or it may comprise a Wideband CDMA base station for use in a WCDMA-based wireless communication network. Further, it will be understood that the base station 10 generally comprises radio receiver circuits for receiving uplink wireless communication signals from mobile stations being supported by the base station 10, in addition to the illustrated transmit-related circuitry in FIG. 1, used for transmitting forward link signals, e.g., carrier signals, to such mobile stations.

The control unit 12 is arranged to switch at least a first MCPA in the set of multi-carrier power amplifiers 16 such that the at least first MCPA stops providing power amplification to at least a first subset of the set of base station transmitters 14, and switch at least a second MCPA in the set of multi-carrier power amplifiers 16 such that the at least second MCPA starts to provide power amplification to the at least first subset of the set of base station transmitters 14. This switching control function of the control unit 12 may thus for each one of the base station transmitters 14 determine which one of the MCPAs 16 will be used to provide the base station transmitters 14 with required power amplification during different periods in time. This allows for base station transmitters that may require a high or peak power amplification for longer periods of time to share the power capability of several MCPAs and thus not suffer from being limited in the output power amplification by the maximum average power requirement of a single MCPA. The switching control function of the control unit 12 according to one or more embodiments is described more in detail in reference to FIGS. 3-8 below.

However, to better understand the control switching function of the control unit 12 in the overall base station context, one will note that the base station 10 comprises network interface circuits 20, communication control and processing circuits 22, baseband units 24-1, 24-2, etc., interface circuit 26, radio units 28-1, 28-2, etc., and transmit antenna(s) 30.

The network interface circuits 20 communicatively couple the base station 10 to other entities within a supporting wireless communication network, such as, other radio access network entities or core network entities, and send/receive call data, timing, and signaling information. The communication control and processing circuits 22 provide call control and signaling for sending and receiving wireless communication signals to and from mobile stations (not shown) being supported by the base station 10.

To that end, and referring to any given one of the baseband units 24-1, 24-2, etc., simply as "baseband unit 24," each baseband unit 24 generates one or more transmit signals (carrier signals) for power amplification by one or more of the MCPAs 16. Generally, each base station transmitter 14-1, 14-2, etc., within a given baseband unit 24 outputs a carrier signal for transmission at a given carrier frequency or sequence of carrier frequencies if frequency hopping is utilized. Referring to any given base station transmitter 14-1, 14-2, etc., simply as "transmitter 14," it will be understood that in one or more embodiments each transmitter 14 receives baseband information for carrying out signal modulation according to a given modulation/transmit signal format. Each transmitter 14 therefore may be understood as outputting a carrier signal, in either the digital or analog domains. In at least one embodiment, each transmitter 14 outputs a digital domain carrier signal that is provided to one or more of the MCPAs 16 for conversion to analog domain and power amplification according to the control switching function of the control unit 12. In this regard, each MCPA 16 in one or more embodiments can receive carrier signals from any one of the transmitters 14 and can receive corresponding required power amplification information, or power control information, corresponding to such information.

In any case, it should be understood that the carrier signals from all the transmitters 14 can be coupled to the signal inputs of the MCPAs 16-1, 16-2, etc., through the interface 26 for power amplification. Further, it should be understood that each MCPA 16 can be implemented with a single, wideband power amplifier that uses input combining to create a combined signal for wideband amplification, based on combining the carrier signals input to the MCPA 16.

Of course, the control switching function of the control unit 12 taught herein is not dependent on the particular internal implementation details of the MCPAs 16, nor on the particular transmitter-to-MCPA interface implementation. However, in one example embodiment, which has certain implementation advantages, the interconnections between the transmitters 14 and the MCPAs 16 are based on the Common Public Radio Interface (CPRI) standards, as promulgated by an industry consortium that includes ERICSSON AB, HUAWEI, NEC, NORTEL, NOKIA SIEMENS NETWORKS, and ALCATEL-LUCENT. See, for example, the document entitled, Common Public Radio Interface (CPRI); Interface Specification, V4.0 (2008-06-30).

According to CPRI or another digital-domain transmitter-to-MCPA interfacing implementation, all individual (digital) baseband units 24, including their respective transmitters 14, can be connected to all individual radio units 28, including their respective MCPAs 16. In at least one such embodiment, the interface circuit(s) 26 are subsumed into the digital control and signaling connections communicatively linking the transmitters 14 to the MCPAs 16. It should also be noted that the interconnections between transmitters 14 and MCPAs 16 can be implemented using a ring or serial topology and that the interface circuit(s) 26 depicted in FIG. 1 may therefore represent these and other connection topologies. For CPRI-based implementation, the interface is digitized (layer one options with electrical or optical), and the digital-format carrier signals from each transmitter 14 to the radio units 28 may be represented as the In-phase/Quadrature (I/Q) bursts that shall be transmitted, and may comprise information indicating the required transmit power for the burst transmission. For example, a given baseband unit 24 sends the burst information for its transmitters 14 to the radio unit(s) 28, and, if the connections between the baseband units 24 and the radio units 28 are not unique, each baseband unit 24 can include addressing information for the corresponding radio unit 28.

It should be understood that the base station 10 according to FIG. 1 may comprise a centralized control unit 12 having interconnection controls with the baseband units 24, the interface circuit(s) 26 and/or the radio units 28. However, particularly in base station embodiments wherein the interface 26 between transmitters 14 and MCPAs 16 is digital, the control switching function of the control unit 12 may remain a centralized function, or may be implemented in distributed fashion. That is; the intelligence for determining the configuration between transmitters 14 and MCPAs 16 may, for example, reside in distributed fashion in the radio units 28, in the baseband units 24, or partly in both. For example, in one embodiment, the control switching operations of the control unit 12 may send switching information to the baseband units 24 so that properly addressed "requests" can be sent from the baseband units 24 to the radio units 28. In another embodiment, the baseband units 24 simply send transmit information, e.g., carrier signal data, to one or more of the radio units 28 and the control unit 12 send switching information to the MCPAs 16 to control which of the MCPAs should provide power amplification to which of the given carrier signals from any given one of the transmitters 14. In a further embodiment, the control switching function of the control unit 12 may send a configuration message to the interface circuit 26 which informs the interface circuit 26 of which of the transmitters 14 in the baseband units 24 should be associated with which MCPAs 16 in the radio units 28.

Figure 2:
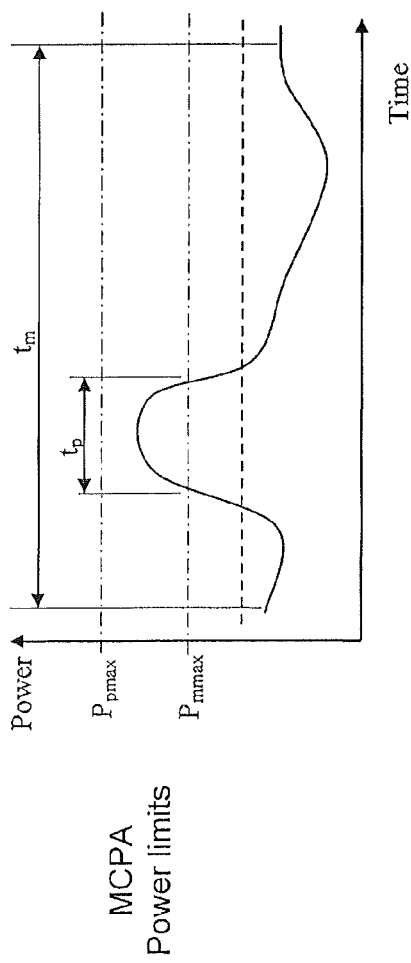
FIG. 2 is a diagram of the power amplification limits of an MCPA.

FIG. 2 shows a diagram that illustrates the power amplification limits of an MCPA. As described in the above, the MCPAs 16 may combine all carrier input signals from its transmitters 14, respectively, into one composite signal for transmission. The composite signal for transmission is then converted into an analog signal, up-converted into the radio frequency domain (RF) and amplified. For a satisfying end user performance regarding, for example, data rate transmissions or speech quality etc., each transmitters 14 carrier output signal needs to be transmitted with a sufficient amount of transmit power. However, the requirements on the amount of transmit power that each transmitters 14 carrier output signal needs varies significantly over time. The required transmit powers of the base station transmitters 14 may change, for example, as a function of changing radio conditions, changing numbers of users, or changing mixes of communication service types, etc.

In view of the required transmit powers of the base station transmitters 14, an important aspect of the MCPAs 16, regarding capability or limit on the amount of power amplification that may be provided each MCPA, is shown in FIG. 2. In FIG. 2, the fully drawn line in the diagram illustrates the instantaneous or momentary power amplification provide to one or more transmitters 14 by an MCPA. The dashed line in the diagram illustrates the average or mean power amplification provide to one or more transmitters 14 by the MCPA. The lower dashed dotted line illustrates the maximum average power amplification limit $P_{mmax}$ of the MCPA, and upper dashed dotted line illustrates the maximum peak power amplification limit $P_{pmax}$ of the MCPA. This shows the important aspect of the MCPA that the MCPA comprises a maximum peak power amplification limit $P_{pmax}$ that is higher than the maximum average power amplification limit $P_{mmax}$. It follows that for a short period of time $t_p$ the MCPA may generate maximum high or peak power amplification, i.e. a peak power amplification that is higher than the maximum average power amplification limit $P_{mmax}$ but lower than the maximum peak power amplification limit $P_{pmax}$, provided that over a longer period of time $t_m$ the average power amplification is not higher than the maximum average power amplification limit $P_{mmax}$. This important aspect of the MCPAs 16 allows the MCPAs 16 to be overallocated in order to utilize as much of the power amplification capabilities of the MCPAs 16 as possible.

In order to save cost for hardware and power consumption of the transmitters 14 and the MCPAs, it is beneficial to be able to handle as many transmitters 14 as possible with a single MCPA. To obtain this, the power capacity of the MCPA is often over-allocated. For example, four 20 W transmitters 14 can be allocated to a single 60 W MCPA. However, in order to make this over-allocation work, three different common mechanisms may be utilized: statistical multiplexing, temporary overpower, and controlled back-off. Statistical multiplexing utilizes and takes advantage of the fact that the transmitters 14 will not send with full transmit power requirements all of the time (unless it carries a Broadcast Control Channel, BCCH). On the contrary, it is highly unlikely that all transmitters 14 will send with full transmit power requirements all of the time. By further utilizing maximum peak power amplification as described above, the MCPAs 16 may also supply short periods of overpower to the transmitters 14. The latter may be referred to as temporary overpower. If it is further detected that the average power amplification will potentially exceed or is running a risk of exceeding the nominal average power amplification limit $P_{mmax}$ of an MCPA, the power amplification of the least prioritized transmitter or transmitters 14 may be backed off. This may be referred to as controlled back-off.

However, even with the mechanisms described above implemented, the number of transmitters, e.g. 14-1, . . . , 14-N, with a certain output power amplification that can be handled with one MCPA, e.g. 16-1, is limited. That is, if one of the transmitters 14-1, . . . , 14-N momentarily needs high or peak power amplification, e.g. during handover or to increase data rates due to high interference, this can be hard to satisfy when the power amplification of the one MCPA 16-1 is divided among the transmitters 14-1, . . . , 14-N. Thus, conventional dimensioning and matching according to this approach is limited.

In reference to FIGS. 3 and 6 below, the control switching function of the control unit 12 according to one or more embodiments of the invention is described. It allows all transmitters 14 in the baseband units 24 to share the available MCPAs 16 by using the MCPAs 16 in sequence. By doing so, it is instead the average power amplification of all of the transmitters 14 that limits the output power amplification effect of the MCPAs 16, which in turn will increase the benefits of statistical multiplexing, and thus allow for a higher output power amplification to be provided to the transmitters 14 by the MCPAs 16. Thus, a mechanism is also described that further increases the number of transmitters 14 that may be handled by an MCPA 16. However, it should be noted that the invention should not be construed as limited to the particulars of any one of these embodiments, but that these embodiments simply describes the best mode presently contemplated for practising the invention.

Figure 3:
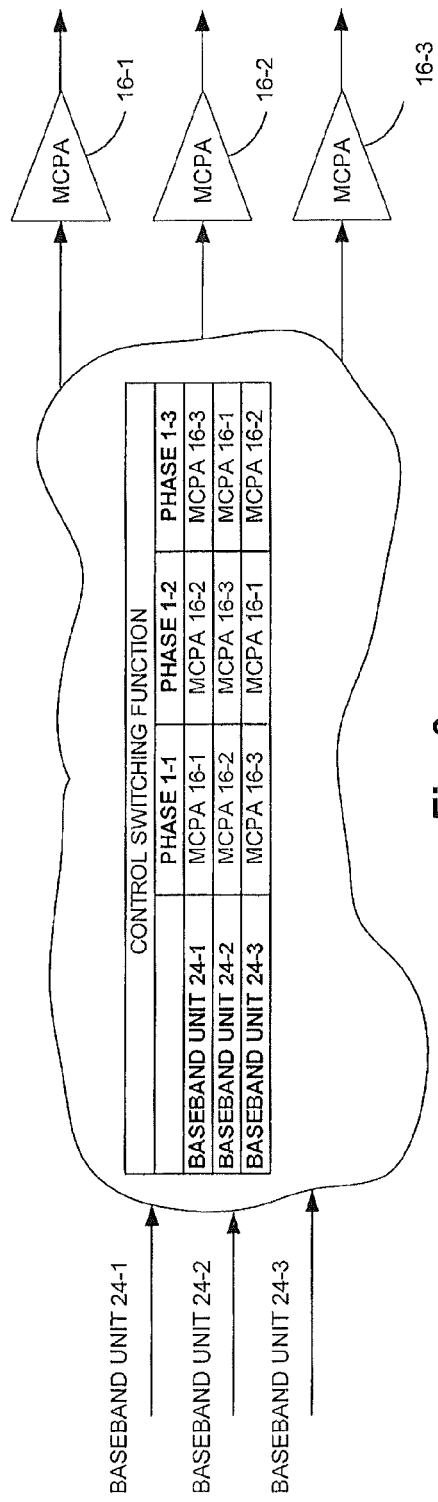
FIG. 3 is a functional diagram of one embodiment of a control switching function, such as may be implemented by the control circuit of FIG. 1, for configuring a set of MCPAs to provide power amplification for a set of base station transmitters.

FIG. 3 is a functional diagram of an embodiment of a control switching function, such as may be implemented by the control circuit of FIG. 1, for configuring a set of MCPAs 16 to provide power amplification for a set of base station transmitters 14. Although FIG. 3 only depicts the exemplary case of having three MCPAs 16 being configured to provide power amplification for three baseband units 24, it should be understood that control switching functions may be arranged for any number of baseband units 24 and/or MCPAs 16 in a similar manner. The control switching function according to FIG. 3 is arranged to switch between three different phases of operation, i.e. PHASE 1-1, PHASE 1-2, and PHASE 1-3. Each phase of operation may comprise a predetermined duration in time, p. Preferably, the predetermined duration in time p of the different phases of operation is longer than a GSM radio burst, and shorter than the maximum allowed time period $t_p$ for the MCPAs 16 to be equal to or exceed its maximum average power $P_{mmax}$.

During PHASE 1-1, the control switching function may be arranged to configure the MCPA 16-1 to provide power amplification to the baseband unit 24-1, the MCPA 16-2 to provide power amplification to the baseband unit 24-2, and the MCPA 16-3 to provide power amplification to the baseband unit 24-3. The control switching function is arranged to automatically switch these configurations inbetween the different phases of operation. It follows that inbetween PHASE 1-1 and PHASE 1-2, the control switching function may be arranged to switch such that during PHASE 1-2 the MCPA 16-1 is configured to provide power amplification to the baseband unit 24-3, the MCPA 16-2 is configured to provide power amplification to the baseband unit 24-1, and the MCPA 16-3 to provide power amplification to the baseband unit 24-2. In a similar manner, the control switching function may be arranged to perform a switch inbetween PHASE 1-2 and PHASE 1-3. This may be performed such that during PHASE 1-3 the MCPA 16-1 is configured to provide power amplification to the baseband unit 24-2, the MCPA 16-2 is configured to provide power amplification to the baseband unit 24-3, and the MCPA 16-3 to provide power amplification to the baseband unit 24-1. At the end of PHASE 1-3, the control switching function may be arranged to switch back to the configuration according to PHASE 1-1 such that each phase of operation is sequentially iterated (repeated) over time (i.e. PHASE 1-1, PHASE 1-2, PHASE 1-3, PHASE 1-1, PHASE 1-2, PHASE 1-3, PHASE 1-1, etc.). This can also be described as, if $t_0$ is an arbitrary start time and p is the predetermined duration in time of each of the different phases of operation, the configuration according to PHASE 1-1 is active from $t_0$ to $t_0+p$, the configuration according to PHASE 1-2 is active from $t_0+p$ to $t_0+2p$, the configuration according to PHASE 1-3 is active from $t_0+2p$ to $t_0+3p$, and then the configuration according to PHASE 1-1 is again active from $t_0+3p$ to $t_0+4p$, etc. It should also be understood that other timing sequences or different configuration setups may be implemented in order to achieve the desired effect according to this embodiment.

Controlling the MCPAs 16 to provide the power amplification according to the control switching function of the control unit 12 may comprise, in at least one embodiment, indicating the switching to the MCPAs 16, directly or indirectly, via digital signaling from the control unit 12. In particular, the control unit 12 in one or more embodiments may generate digital command words that indicate which MCPAs 16 are to provide the power amplification of each of the basebands units 24 and its transmitters 14. These command words may be sent directly from the control unit 12, such as over a digital communication bus, to the interface circuit 26, the radio units 28, or to the baseband units 24, which in turn send corresponding allocation requests to the radio units 28. It should be noted that the base station 10 in one or more embodiments may comprise one or more computer systems that are configured to carry out the desired base station operations based on the execution of stored computer program instructions. For example, the communication control and processing circuits may comprise one or more microprocessor-based circuit cards, each having access to non-volatile memory (FLASH, EEPROM, etc.), or to another computer readable medium (e.g., hard drive), storing computer program instructions organized as one or more computer programs. In particular, the control unit 12 may be implemented in hardware, software, or any combination thereof. In one embodiment, the control unit 12 is implemented in one or more microprocessors, based on the execution of stored computer program instructions, which configure the one or more microprocessors to carry out an algorithm incorporating, for example, the method of FIG. 7 as described below, according to any one or more defined control switching functions. Of course, the control unit 12 may also be implemented using dedicated hardware implemented in programmed logic, such as implementation via one or more Field Programmable Gate Arrays (FPGAs), Complex Programmable Logic Devices (CPLDs), Application Specific Integrated Circuits (ASICs), with or without microprocessor-based execution cores, or via some other digital circuitry.

The embodiments described above may be particularly useful when the design base solution according to conventional base station design and matching is not able to provide enough power amplification and back-offs are deemed to frequent. This may for example be the case in large cells, cells with much high-order modulation data traffic and/or cells covering areas with a high amount of damping occurring due to e.g. tunnels, cellars and/or buildings with thick walls. A further advantage of this embodiment in addition to the advantages already mentioned above, is that it allows for a reduced drop rate for telecommunication devices that are experiencing bad reception by being able to provide an increased output power amplification to these telecommunication devices. Advantageously, it may also allow for an increase in the coverage of areas located more distantly to the base station, and for an increase in the data rate for downlink data transfer by ensuring that the most efficient modulation methods are used, by providing a sufficient signal-to-noise ratio, and by providing a higher output power amplification than that enabled by conventional base station design and matching. The higher output power amplification is provided by the improved statistical multiplexing advantages when multiplexing over an increased number of transmitters 14. Also, the advantages of using temporary overload are increased. For example, even if one transmitter 14 requires a sustained high power amplification by the MCPAs 16, this high power amplification may be evenly distributed amongst the MCPAs 16 and thus reduce the risk of exceeding the maximum average power amplification limit $P_{mmax}$ of anyone of the MCPAs 16. By utilizing the fact that different cells may have different usage patterns, for example, an urban cell may be heavily loaded during daytime, while a suburban cell instead may be heavily loaded during evenings and weekends, the multiplexing gains may also be increased.

According to one embodiment, when the base station 10 comprises a GSM base station for use in a GSM-based wireless communication network, it may be beneficial to allow the switching of the control switching function to occur during so called "guard periods" of the GSM signal. Generally, a GSM signal comprises GSM bursts which may be 148 bit periods in duration and separated by "guard periods" which may be 8.25 bit periods in duration. A bit period may here be defined as 48/13 µs, that is, approximately 3.69 µs. By performing the switching of the control switching function during these "guard periods" it may be ensured that GSM signal data is unaffected by the switching of the control switching function.

Figure 4:
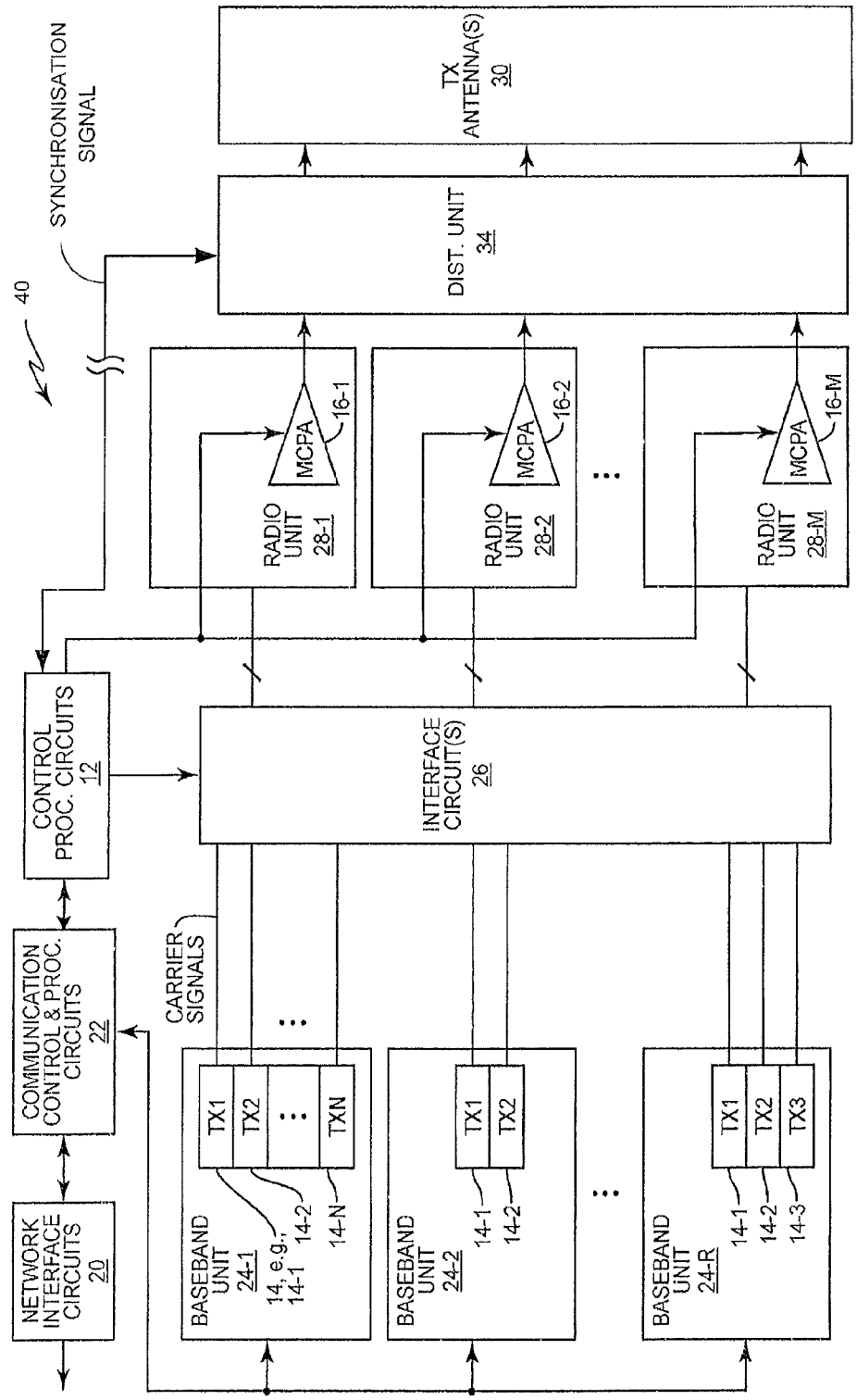
FIG. 4 is a block diagram of another embodiment of a base station that comprises a control circuit providing transmitter to MCPA configuration.

FIG. 4 is a block diagram of another embodiment of a base station 40 that comprises a control circuit 12 providing transmitter to MCPA configuration. The base station 40 may be identical to the base station 10 according to FIG. 1, except in that it may further comprise a distributing unit 34. The control unit 12 may be arranged to be synchronised with the distributing unit 34 such that the switch of the transmitter to MCPA configuration by the switching control function in the control unit 12 as described in the previous embodiment is synchronised with the distribution of antenna signals from the MCPAs 16 to different transmit antennas 30 performed by the distributing unit 34. A synchronisation signal may established between the control unit 12 and the distributing unit 34 such that the control unit 12 and the distributing unit 34 may keep a common time base $t_0$ and predetermined duration in time p of the different phases of operation. The control unit 12 may be communicatively coupled to the distributing unit 34, for example, by a synchronisation cable or wireless connections. This embodiment allows, for example, each of the baseband units 24 in the base station 40 to each be assigned to and support separate cells, while still sharing the power amplification capabilities of the MCPAs 16 in the base station 40 as described above in reference to the base station 10 in FIG. 1. The distributing unit function of the distributing unit 34 according to one or more embodiments is described more in detail in reference to FIG. 5-6 below.

Figure 5:
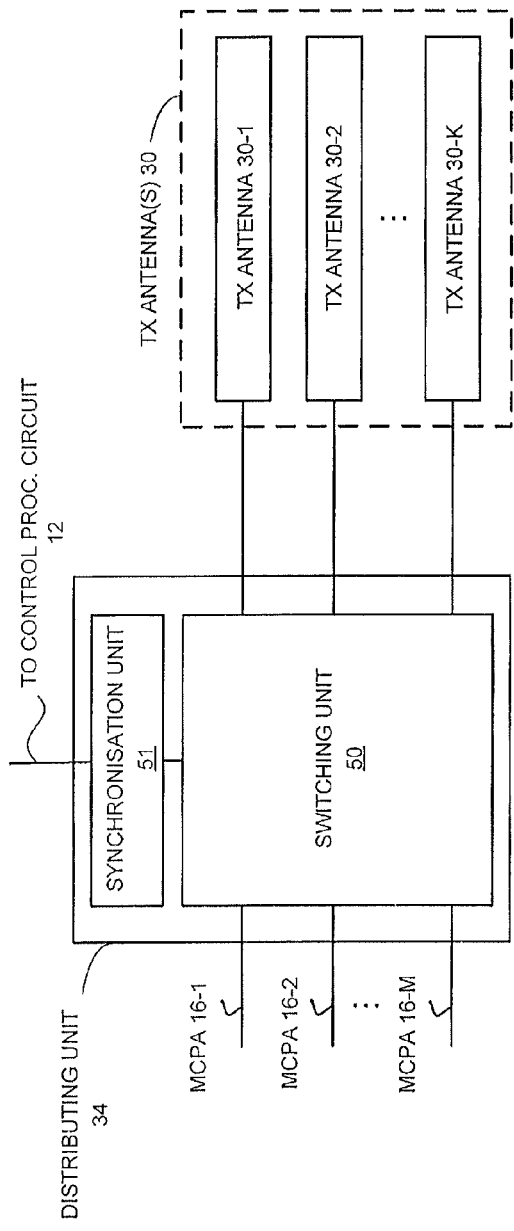
FIG. 5 is a block diagram of one embodiment of a distributing unit and transmitting antennas that connects to the base station as shown in FIG. 4.

FIG. 5 is a block diagram of one embodiment of a distributing unit 34 and transmitting antennas 30 that connects to the base station 40 as shown in FIG. 4. It should be noted that the synchronisation unit 51 and switching unit 50 may be provided as one physical unit, or alternatively as a plurality of logically interconnected units. The synchronistation unit 51 and switching unit 50 may also comprise processing means or logic for performing the functionality of the distributing unit function of the distributing unit 34. This functionality may be implemented wholly or partly by means of a software or computer program. The synchronistation unit 51 and switching unit 50 may also comprise storage means or a memory unit for storing such a computer program and processing means or a processing unit, such as a microprocessor, for executing the computer program. The storage means may be a readable storage medium, but a memory storage unit separated from, but connected to the synchronistation unit 51 and switching unit 50. When, in the following, it is described that the distributing unit function of the distributing unit 34 performs a certain function or operation it is to be understood that the synchronistation unit 51 and/or switching unit 50 may use the processing means or logic to execute a certain part of the program which is stored in the storage means.

The switching unit 50 is arranged to receive antenna signals from the MCPAs 16 in the base station 40 and continuously distribute these antenna signals the MCPAs 16 to different transmit antennas 30 in accordance with targeted MCPAs for the different transmit antennas 30. The term "targeted" MCPAs here refers to the MCPA 16 which is currently, during a particular phase of operation, providing power amplification to the specific baseband unit 24 and its transmitters 14 arranged to output carrier signals to a specific transmit antenna of the transmit antennas 30 which is covering the particular cell associated with the specific baseband unit 24 and its transmitters 14. Thus, by during different phases of operation PHASE 2-1, PHASE 2-2 and PHASE 2-3, switching which MCPA 16 that is currently feeding which specific transmit antenna of the transmit antennas 30 according to the distributing unit function of the distributing unit 34 specifying the current "targeted" MCPA 16 for the specific transmit antenna of the transmit antennas 30, the switching unit 50 is arranged to ensure that the output carrier signals of the baseband units 24 and its transmitters 14 is outputted or fed to the specific transmit antenna that is covering the cell associated with the specific baseband unit 24 and its transmitters 14.

The synchronisation unit 51 is arranged to synchronise the switching unit 50 with the control Unit 12 in the base station 40 such that the distribution of the antenna signals from the MCPAs 16 to different transmit antennas 30 in accordance with targeted MCPAs for the different transmit antennas 30 in the switching unit 50, i.e. the distributing unit function in the distributing unit 34, is synchronised with the switch of the MCPAs 16 performed by the control unit 12 in the base station 40. As described in reference to FIG. 4 above, this may be performed by, for example, establishing a synchronisation signal between the control unit 12 and the distributing unit 34, i.e. the synchronisation unit 51, such that the control unit 12 and the synchronisation unit 51 may keep a common time base $t_0$ and predetermined duration in time p for the different phases of operation. The synchronisation signal may for example be sent through a synchronisation cable or through wireless connections. Thus, the control and timing schedule of the switching operations of both the control switching function in the control unit 12 in the base station 40 and the distributing unit function in the distributing unit 34 may be configured according to the same time base $t_0$ and with the same time length of the different phases of operation, i.e. predetermined duration in time p, and thus be synchronised with each other. This means that the different phases of operation PHASE 1-1, PHASE 1-2 and PHASE 1-3 and the switching therein between of the control switching function in the control unit 12 in the base station 40 may be synchronised with the different phases of operation PHASE 2-1, PHASE 2-2 and PHASE 2-3 and the switching therein between of the distributing unit function in the distributing unit 34.

Figure 6:
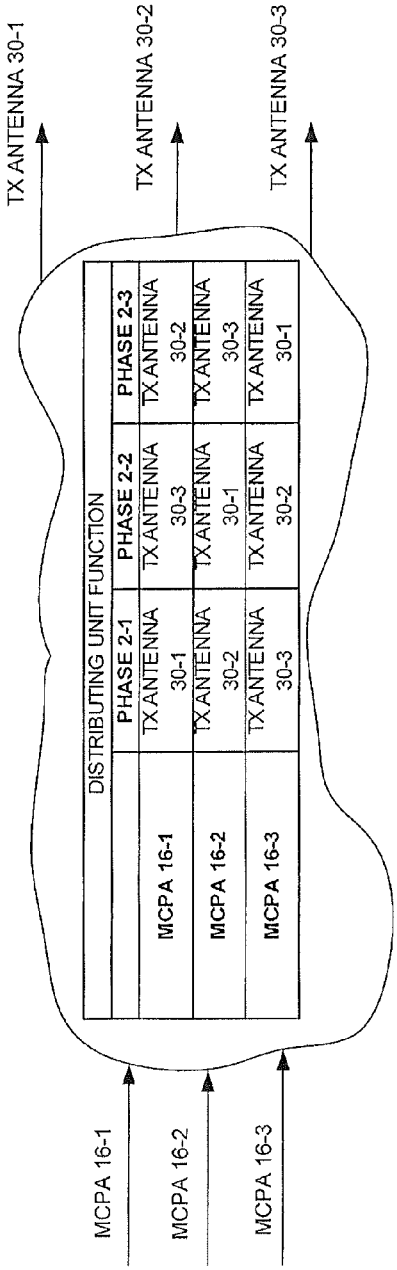
FIG. 6 is a functional diagram of one embodiment of a distributing unit function, such as may be implemented by the distributing unit of FIG. 4-5, for configuring a set of MCPAs to provide power amplification for a set of base station transmitters.

FIG. 6 is a functional diagram of an embodiment of a distributing unit function, such as may be implemented by the distributing unit 34 of FIG. 4-5, for configuring a set of MCPAs to provide power amplification for a set of base station transmitters. Similar to the description in reference to FIG. 3 above, although FIG. 6 only depicts the exemplary case of having three MCPAs 16 being configured to output or feed power amplified carrier signals for three different transmit antennas 30, it should be understood that distributing unit function may be arranged for any number of MCPAs 16 and/or transmit antennas 30 in a similar manner. For illustrative purposes, the distributing unit function according to the exemplary case of FIG. 6 is arranged to be synchronised with the sharing of the power amplification capabilities of the MCPAs 16 in the base station 40. This is described in more detail above in reference to the base station 10 in FIG. 1. To further illustrated the principle of this embodiment the three different transmit antennas 30-1, 30-2 and 30-3 may here, for example, be arranged to each cover three separate cells.

The distributing unit function according to FIG. 6 is arranged to switch between three different phases of operation, i.e. PHASE 2-1, PHASE 2-2, and PHASE 2-3. Each phase of operation may comprise a predetermined duration in time, p. Preferably, the predetermined duration in time p of the different phases of operation is longer than a GSM radio burst, and shorter than the maximum allowed time period $t_p$ for the MCPAs 16 to be equal to or exceed its maximum average power $P_{mmax}$.

During PHASE 2-1, the distributing unit function may be arranged to output the power amplified carrier signals of the MCPA 16-1 to the transmit antenna 30-1, the power amplified carrier signals of the MCPA 16-2 to the transmit antenna 30-2, and the power amplified carrier signals of the MCPA 16-3 to the transmit antenna 30-3. For illustrative purposes it may here be assumed that the output carrier signals of the baseband unit 24-1 is here associated with the cell that is covered by the transmit antenna 30-1, the output carrier signals of the baseband unit 24-2 is here associated with the cell that is covered by the transmit antenna 30-2, and the output carrier signals of the baseband unit 24-3 is here associated with the cell that is covered by the transmit antenna 30-3. The distributing unit function is arranged to automatically switch these output configurations inbetween the different phases of operation. It follows that inbetween PHASE 2-1 and PHASE 2-2, the distributing unit function may be arranged to switch such that during PHASE 2-2 the power amplified carrier signals of the MCPA 16-1 is outputted to the transmit antenna 30-3, the power amplified carrier signals of the MCPA 16-2 is outputted to the transmit antenna 30-1, and the power amplified carrier signals of the MCPA 16-3 is outputted to the transmit antenna 30-2. In a similar manner, the distributing unit function may be arranged to perform a switch inbetween PHASE 2-2 and PHASE 2-3. This may be performed such that during PHASE 2-3 the power amplified carrier signals of the MCPA 16-1 is outputted to the transmit antenna 30-2, the power amplified carrier signals of the MCPA 16-2 is outputted to the transmit antenna 30-3, and the power amplified carrier signals of the MCPA 16-3 is outputted to the transmit antenna 30-1. At the end of PHASE 2-3, the distributing unit function may be arranged to switch back to the configuration according to PHASE 2-1 such that each phase of operation is sequentially iterated (repeated) over time. This can also be described as, if $t_0$ is an arbitrary start time and p is the predetermined duration in time of each of the different phases of operation, the configuration according to PHASE 2-1 is active from $t_0$ to $t_0+p$, the configuration according to PHASE 2-2 is active from $t_0+p$ to $t_0+2p$, the configuration according to PHASE 2-3 is active from $t_0+2p$ to $t_0+3p$, and then the configuration according to PHASE 2-1 is again active from $t_0+3p$ to $t_0+4p$, etc. It should also be understood that other timing sequences or different configuration setups may be implemented in order to achieve the desired effect according to this embodiment. Thus, this embodiment ensures that the output carrier signals of the baseband units 24 and its transmitters 14 is outputted or fed to the specific transmit antenna that is covering the cell associated with that specific baseband unit 24 and its transmitters 14.

According to a further embodiment, when the base station 10 comprises a GSM base station for use in a GSM-based wireless communication network, it may also here be beneficial to allow the switching of the distributing unit function to occur during the "guard periods" of the GSM signal. By performing the switching of the distributing unit function during these "guard periods" it may be ensured that the switching of the distributing unit function occurs when the output effect of the transmit antennas 30 are low or null as compared to during the output effect of the transmit antennas 30 during a GSM burst. Additionally, a beneficial effect is that this may simplify the design of the distributing unit. In turn, a simplified design may lead to cost savings or reductions.

FIG. 7 is a logic flow diagram of one embodiment of a method for configuring a set of MCPAs to provide power amplification for a set of base station transmitters. In step S71, the switching control function of the control unit 12 may be arranged to switch at least a first MCPA such that the at least first MCPA stops providing power amplification to at least a first subset of base station transmitters. In step S72, the switching control function of the control unit 12 may be arranged to switch at least a second MCPA such that the at least second MCPA starts to provide power amplification to the at least first subset of base station transmitters. This switching control function of the control unit 12 may thus determine which one of the MCPAs 16 will be used to provide the base station transmitters required power amplification during different periods in time. This allows for base station transmitters that may require peak power amplification for longer periods of time to share the power capability of several MCPAs and thus not suffer from being limited in the output power amplification by the maximum average power requirement of a single MCPA.

FIG. 8 is a logic flow diagram of another embodiment of a method for configuring a set of MCPAs to provide power amplification for a set of base station transmitters.

In step S81, the switching control function of the control unit 12 may be arranged to switch at least a first MCPA such that the at least first MCPA stops providing power amplification to at least a first subset of base station transmitters. In step S82, the switching control function of the control unit 12 may be arranged to switch at least a second MCPA such that the at least second MCPA starts to provide power amplification to the at least first subset of base station transmitters. In step S83, the switching control function of the control unit 12 may be arranged to synchronise the switching of the at least first and second MCPAs in steps S81-S82 with the distribution of antenna signals to different transmit antennas performed by a distributing unit 34. This embodiment allows, for example, each of the baseband units 24 in the base station 40 to each be assigned to and support separate cells, while still sharing the power amplification capabilities of the MCPAs 16 in the base station 40.

It is to be understood that further specifications of each of the steps S71-S72 of the method according to the embodiment described in reference to FIG. 7 and each of the steps S81-S83 of the method according to the embodiment described in reference to FIG. 8, or possible additional steps to each of the methods, has been described in reference to the corresponding base station embodiments presented above.

The description above is of the best mode presently contemplated for practising the invention. The description is not intended to be taken in a limiting sense, but is made merely for the purpose of describing the general principles of the invention. The scope of the invention should only be ascertained with reference to the issued claims.

The invention claimed is:

1. A method for configuring a set of multi-carrier power amplifiers, MCPAs, to provide power amplification for a set of base station transmitters, said method comprising:
   switching at least a first MCPA in the set of multi-carrier power amplifiers such that the at least first MCPA stops providing power amplification to at least a first subset of the set of base station transmitters, and
   switching at least a second MCPA in the set of multi-carrier power amplifiers such that the at least second MCPA starts to provide power amplification to the at least first subset of the set of base station transmitters;
   wherein said switching of the at least first and second MCPAs in the set of multi-carrier power amplifiers is performed such that each of the at least first and second MCPAs in the set of multi-carrier power amplifiers sequentially provides power amplification to each of the at least first and second subset of the set of base station transmitters in sequence during different phases of operation.

2. A method according to claim 1, wherein said switching at least a first MCPA in the set of multi-carrier power amplifiers further comprises switching the at least first MCPA in the set of multi-carrier power amplifiers such that the at least first MCPA starts to provide power amplification to at least a second subset of the set of base station transmitters.

3. A method according to claim 1, wherein said switching at least a second MCPA in the set of multi-carrier power amplifiers further comprises switching the at least second MCPA in the set of multi-carrier power amplifiers such that the at least second MCPA stops to provide power amplification to at least a second subset of the set of base station transmitters.

4. A method according to claim 1, wherein said switching of the at least first and second MCPAs in the set of multi-carrier power amplifiers is performed substantially simultaneously.

5. A method according to claim 1, wherein said switching of the at least first and second MCPAs in the set of multi-carrier power amplifiers comprises automatically switching in between the different phases of operation, each phase of operation having a predetermined duration in time (p), which are sequentially iterated over time.

6. A method according to claim 5, wherein the duration in time (p) of a phase of operation is longer than a GSM radio burst, and shorter than the maximum allowed time period ($t_p$) for the MCPAs to be equal to or exceed its maximum mean power ($P_{mmax}$).

7. A method according to claim 1, wherein said switching of the at least first and second MCPAs in the set of multi-carrier power amplifiers comprises synchronising said switching of the at least first and second MCPAs in the set of multi-carrier power amplifiers with the distribution of antenna signals from the set of multi-carrier power amplifiers to different transmit antennas performed by a distributing unit.

8. A base station comprising:
   a set of base station transmitters and a set of multi-carrier power amplifiers, MCPAs, to provide power amplification for the set of base station transmitters; and
   a control unit that is configured to
      switch at least a first MCPA in the set of multi-carrier power amplifiers such that the at least first MCPA stops providing power amplification to at least a first subset of the set of base station transmitters, and
      switch at least a second MCPA in the set of multi-carrier power amplifiers such that the at least second MCPA starts to provide power amplification to the at least first subset of the set of base station transmitters;

wherein the control unit is further arranged to switch the at least first and second MCPAs in the set of multi-carrier power amplifiers such that each of the at least first and second MCPAs in the set of multi-carrier power amplifiers sequentially provides power amplification to each of the at least first and second subset of the set of base station transmitters in sequence during different phases of operation.

9. A base station according to claim 8, wherein the control unit is further configured to switch said at least first MCPA in the set of multi-carrier power amplifiers such that the at least first MCPA stops providing power amplification to at least a first subset of the set of base station transmitters and starts to provide power amplification to at least a second subset of the set of base station transmitters.

10. A base station according to claim 8, wherein the control unit is further arranged to switch said at least second MCPA in the set of multi-carrier power amplifiers such that the at least second MCPA starts to provide power amplification to the at least first subset of the set of base station transmitters and stops to provide power amplification to at least a second subset of the set of base station transmitters.

11. A base station according to claim 8, wherein the control unit is further arranged to switch the at least first and second MCPAs in the set of multi-carrier power amplifiers substantially simultaneously.

12. A base station according to claim 8, wherein the control unit is further arranged to switch the at least first and second MCPAs in the set of multi-carrier power amplifiers automatically in between the different phases of operation, wherein the different phases of operation are sequentially iterated over time and each phase of operation has a predetermined duration in time.

13. A base station according to claim 8, wherein the base station is further communicatively connectable to a distributing unit; and the control unit is further configured to be synchronised with a synchronisation unit in the distributing unit such that the switch of the at least first and second MCPAs in the set of multi-carrier power amplifiers is synchronised with the distribution of antenna signals from the set of multi-carrier power amplifiers to different transmit antennas performed by the synchronisation unit in the distributing unit.

14. A distributing unit communicatively connectable to a base station according to claim 13, comprising:

a switching unit arranged to receive antenna signals from a set of multi-carrier power amplifiers in the base station and continuously distribute the antenna signals from the set of multi-carrier power amplifiers to different transmit antennas in accordance with targeted MCPAs for the different transmit antennas.

15. A distributing unit according to claim 14, wherein the distributing unit further comprises:

a synchronisation unit arranged to synchronise the switching unit with a control unit in the base station such that the distribution of the antenna signals from the set of multi-carrier power amplifiers to different transmit antennas in accordance with targeted MCPAs for the different transmit antennas in the switching unit is synchronised with the switch of the at least first and second MCPAs in the set of multi-carrier power amplifiers performed by the control unit in the base station.

\* \* \* \* \*